(12) United States Patent
Lee et al.

(10) Patent No.: US 11,404,132 B2
(45) Date of Patent: Aug. 2, 2022

(54) METHOD FOR MEASURING INTERFERENCE IN A MEMORY DEVICE

(71) Applicants: SK hynix Inc., Gyeonggi-do (KR); Korea University Research and Business Foundation, Sejong Campus, Sejong-si (KR)

(72) Inventors: Jae Woo Lee, Sejong-si (KR); Soo Hyun Kim, Sejong-si (KR); Dong Hyun Kim, Sejong-si (KR); Dong Geun Park, Sejong-si (KR); Geun Soo Yang, Sejong-si (KR); Jung Chun Kim, Sejong-si (KR); Sae Yan Choi, Sejong-si (KR)

(73) Assignees: SK hynix Inc., Gyeonggi-do (KR); Korea University Research and Business Foundation, Seiong Campus, Sejong-si (KR)

( * ) Notice: Subject to any disclaimer, the term of this patent is extended or adjusted under 35 U.S.C. 154(b) by 0 days.

(21) Appl. No.: 17/246,900

(22) Filed: May 3, 2021

(65) Prior Publication Data
US 2022/0005534 A1    Jan. 6, 2022

(30) Foreign Application Priority Data

Jul. 6, 2020    (KR) .......................... 10-2020-0083062

(51) Int. Cl.
*G11C 16/34*    (2006.01)
*G11C 16/24*    (2006.01)
(Continued)

(52) U.S. Cl.
CPC ........ *G11C 16/3427* (2013.01); *G11C 16/102* (2013.01); *G11C 16/24* (2013.01);
(Continued)

(58) Field of Classification Search
CPC ... G11C 16/3427; G11C 16/102; G11C 16/24; G11C 16/26; G11C 16/30;
(Continued)

(56) References Cited

FOREIGN PATENT DOCUMENTS

| GB | 2515101 A | * | 12/2014 | ......... G11C 11/5678 |
| JP | H11260093 A | * | 9/1999 | |

(Continued)

OTHER PUBLICATIONS

Lee et al., 1/f noise analysis of replacement metal gate bulk p-type fin field effect transistor, Applied Physics Letters, Feb. 2013, p. 073503, vol. 102, Issue 7, https://doi.org/10.1063/1.4793306.

(Continued)

*Primary Examiner* — Fernando Hidalgo
(74) *Attorney, Agent, or Firm* — IP & T Group LLP

(57) ABSTRACT

A method for measuring interference in a memory device is provided. The method includes: programming a selected memory cell among a plurality of memory cells connected in series between a bit line and a source line; measuring a first noise value of the programmed selected memory cell; programming an adjacent memory cell adjacent to the selected memory cell among the plurality of memory cells; measuring a second noise value of the selected memory cell, after the programming of the adjacent memory cell is completed; and determining interference on the selected memory cell based on the first noise value and the second noise value. The first noise value and the second noise value are measured by detecting a low frequency noise of a cell current of the selected memory cell.

20 Claims, 22 Drawing Sheets

(51) Int. Cl.
  *G11C 16/26* (2006.01)
  *G11C 16/30* (2006.01)
  *G11C 16/10* (2006.01)

(52) U.S. Cl.
  CPC .............. *G11C 16/26* (2013.01); *G11C 16/30* (2013.01); *G11C 16/3459* (2013.01)

(58) Field of Classification Search
  CPC . G11C 16/3459; G11C 16/0483; G11C 16/08; G11C 16/3418; G11C 16/3422; G11C 16/14
  USPC .................................................... 365/185.22
  See application file for complete search history.

(56) References Cited

FOREIGN PATENT DOCUMENTS

| | | | | |
|---|---|---|---|---|
| JP | 2003158444 A | * | 5/2003 | |
| JP | 2009231831 A | * | 10/2009 | ............ G11C 11/40 |
| KR | 10-1102015 B1 | | 1/2012 | |
| KR | 10-2013-0042369 A | | 4/2013 | |
| KR | 10-2019-0074027 A | | 6/2019 | |

OTHER PUBLICATIONS

Lee et al., Sidewall crystalline orientation effect of post-treatments for a replacement metal gate bulk fin field effect transistor, ACS Applied Materials & Interfaces, Sep. 2013, p. 8865-8868, vol. 5, No. 18, https://doi.org/10.1021/am403270m.

Haartman et al., Low-Frequency Noise in Advanced Mos Devices, Chapter 3, Jul. 2007, Springer Science & Business Media, ISBN:978-1-4020-5909-4.

* cited by examiner

| MC1 | Vpass |
| MC2 | Vpass |
| MC3 | Vpass |

| MC1 | Vpass |
| MC2 | Vpgm |
| MC3 | Vpass |

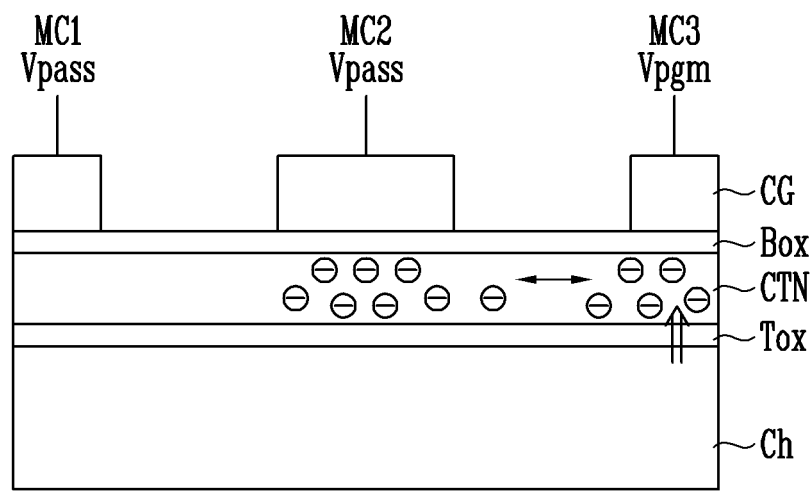

| MC1 | Vpass |
| --- | --- |
| MC2 | Vpass |
| MC3 | Vpass |

| MC1 | Vpass |
| MC2 | Vpass |
| MC3 | Vpass |

| MC1 | Vpgm |
| --- | --- |
| MC2 | Vpass |
| MC3 | Vpgm |

| MC1 | Vpass |
| MC2 | Vpass |
| MC3 | Vpass |

METHOD FOR MEASURING INTERFERENCE IN A MEMORY DEVICE

CROSS-REFERENCE TO RELATED APPLICATION

The present application claims priority under 35 U.S.C. § 119(a) to Korean patent application number 10-2020-0083062 filed on Jul. 6, 2020, and which is incorporated herein by reference in its entirety.

BACKGROUND

Field of Invention

The present disclosure generally relates to an electronic device, and more particularly, to a method for measuring interference in a memory device.

Description of Related Art

A semiconductor device, particularly, a memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied. Examples of the nonvolatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

The flash memory has an advantage of the RAM in which data is freely programmed and erased, and an advantage of the ROM in which stored data is retained even when the supply of power is interrupted. The flash memory is widely used as a storage medium of a portable electronic device, such as a digital camera, a Personal Digital Assistant (PDA), and an MP3 player.

The nonvolatile memory device includes a plurality of memory cells capable of storing data. A threshold voltage of each of the plurality of memory cells is changed due to interference from adjacent memory cells, and therefore, a malfunction may occur in a read operation of stored data.

SUMMARY

Various embodiments of the present disclosure provide a method for measuring interference in a memory device, which can accurately measure interference on memory cells included in the memory device.

In accordance with an aspect of the present disclosure, there is provided a method for measuring interference in a memory device, the method including: programming a selected memory cell among a plurality of memory cells connected in series between a bit line and a source line; measuring a first noise value of the programmed selected memory cell; programming an adjacent memory cell adjacent to the selected memory cell among the plurality of memory cells; measuring a second noise value of the selected memory cell, after the programming of the adjacent memory cell is completed; and determining interference on the selected memory cell based on the first noise value and the second noise value, wherein the first noise value and the second noise value are measured by detecting a low frequency noise of a cell current of the selected memory cell.

In accordance with another aspect of the present disclosure, there is provided a method for measuring interference in a memory device, the method including: measuring an initial noise value of a selected memory cell among a plurality of memory cells connected in series between a bit line and a source line; programming the selected memory cell; measuring a first noise value of the programmed selected memory cell; programming an adjacent memory cell adjacent to the selected memory cell among the plurality of memory cells; measuring a second noise value of the selected memory cell, after the programming of the adjacent memory cell is completed; erasing the selected memory cell and the adjacent memory cell; measuring a third noise value of the selected memory cell, after the selected memory cell and the adjacent memory cell are erased; and determining interference on the selected memory cell based on the initial noise value, the first noise value, the second noise value, and the third noise value.

In accordance with still another aspect of the present disclosure, there is provided a method for measuring interference in a memory device, the method including: measuring an initial noise value of a selected memory cell among a plurality of memory cells connected in series between a bit line and a source line; programming the selected memory cell; measuring a first noise value of the programmed selected memory cell; programming a first adjacent memory cell and a second adjacent memory cell, which are adjacent to the selected memory cell among the plurality of memory cells; measuring a second noise value of the selected memory cell, after the programming of the first adjacent memory cell and the second adjacent memory cell is completed; erasing the selected memory cell, the first adjacent memory cell, and the second adjacent memory cell; measuring a third noise value of the selected memory cell, after the selected memory cell, the first adjacent memory cell, and the second adjacent memory cell are erased; and determining interference on the selected memory cell based on the initial noise value, the first noise value, the second noise value, and the third noise value.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 14 is a sectional view of the memory cells, illustrating operation S850 shown in FIG. 8.

FIG. 15 is a diagram illustrating voltages applied to the memory cells in a program operation of adjacent memory cells in the operation S850 shown in FIG. 8.

DETAILED DESCRIPTION

The specific structural or functional description disclosed herein is merely illustrative for the purpose of describing embodiments according to the present disclosure. The embodiments according to the present disclosure can be implemented in various forms, and should not be construed as limited to the embodiments set forth herein.

Hereinafter, various embodiments of the present disclosure will be described in detail with reference to the accompanying drawings in order for those skilled in the art to be able to readily implement the technical spirit of the present disclosure.

Figure 1:
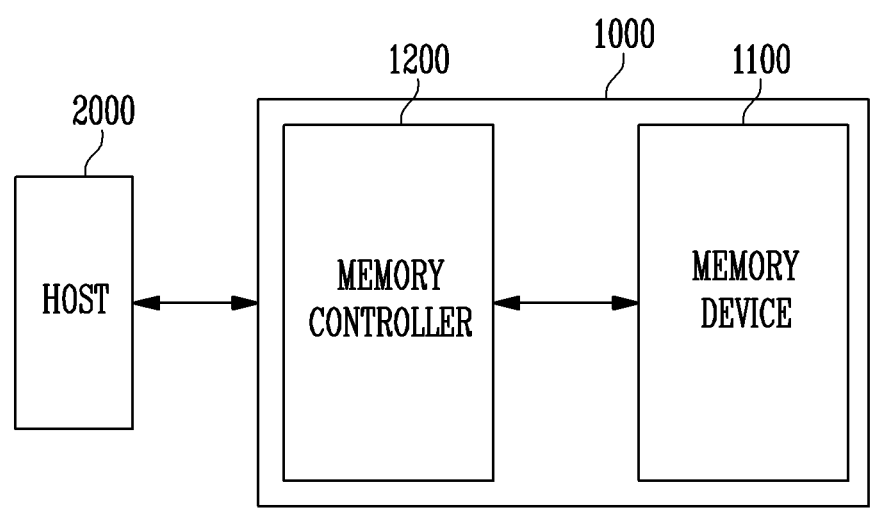
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a memory device 1100 configured to store data and a memory controller 1200 configured to control the memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). In addition, the interface protocol between the host 2000 and the memory system 1000 are not limited to the above-described example, and may be one of other interface protocols such as a Universal Serial Bus (USB), a Multi-Media Card (MMC), an Enhanced Small Disk Interface (ESDI), and an Integrated Drive Electronics (IDE).

The memory device 1100 may perform a program, read or erase operation under the control of the memory controller 1200. The memory device 1100 may include a plurality of memory blocks, and perform program, read, and erase operations on a selected memory block among the plurality of memory blocks.

In accordance with an embodiment of the present disclosure, in an interference measurement operation, the memory device 1100 may measure an initial noise value of a selected memory cell included in a selected memory block, perform a program operation of the selected memory cell and then measure a first noise value of the selected memory cell, perform a program operation of a memory cell adjacent to the selected memory cell and then measure a second noise value of the selected memory cell, and perform an erase operation of the selected memory cell and the adjacent memory cell and then measure a third noise value of the selected memory cell. The measured initial noise value and the measured first to third noise values may be used as basic data for measuring interference on memory cells. For example, a charge trap amount of the selected memory cell and a trap position (depth) of a charge storage layer in which electrons are trapped in a program operation may be calculated by using the initial noise value and the first noise value.

In addition, interference caused by the program operation of the adjacent memory cell may be calculated by using the first noise value and the second noise value, and interference caused by the erase operation may be calculated by using the initial and third noise values.

The memory controller 1200 is connected between the host 2000 and the memory device 1100. The memory controller 1200 accesses the memory device 1100 in response to a request from the host 2000. For example, the memory controller 1200 controls program, read, erase, and background operations of the memory device 1100 in response to a request received from the host 2000. The memory controller 1200 provides an interface between the memory device 1100 and the host 2000. The memory controller 1200 drives firmware for controlling the memory device 1100.

The memory controller 1200 and the memory device 1100 may be integrated into one semiconductor device, to constitute a Solid State Drive (SSD). The SSD includes a storage device configured to store data in a semiconductor memory. When the memory system 1000 is used as the SSD, an operation speed of the host 200 connected to the memory system 1000 is remarkably improved.

In another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multi-Media Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 1100 or the memory system 1000 may be packaged in various forms. For example, the memory device 1100 or the memory system 1000 may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), Plastic Metric Quad Flat Pack (PMQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 2:
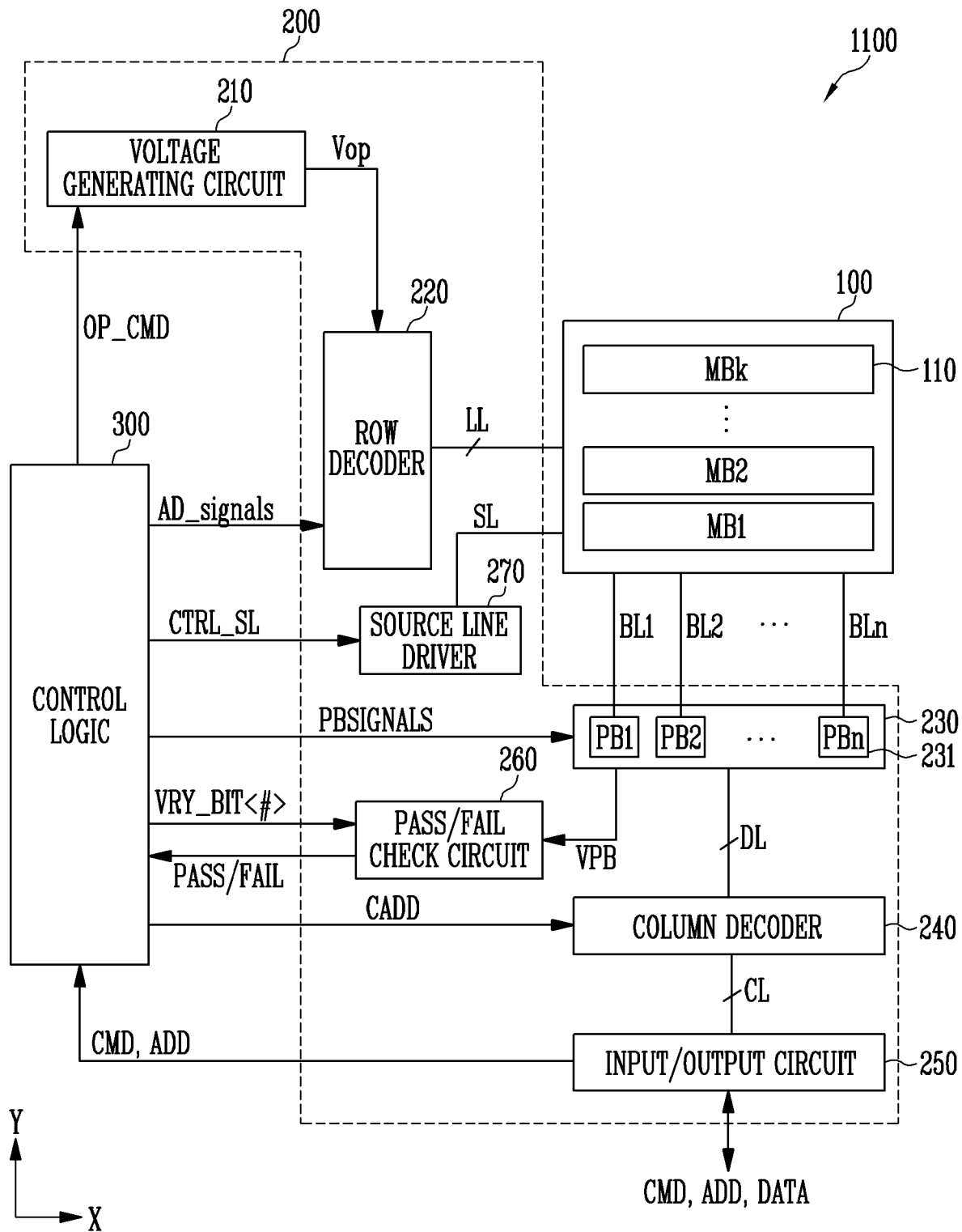
FIG. 2 is a diagram illustrating a memory device shown in FIG. 1.

FIG. 2 is a diagram illustrating the memory device shown in FIG. 1.

Referring to FIG. 2, the memory device 1100 may include a memory cell array 100 in which data is stored. The memory device 1100 may include peripheral circuits 200 configured to perform a program operation for storing data in the memory cell array 100, a read operation for outputting stored data, and an erase operation for erasing stored data. The memory device 1100 may include a control logic 300 which controls the peripheral circuits 200 under the control of the memory controller (1200 shown in FIG. 1).

In an interference measurement operation, the memory device 1100 in accordance with the embodiment of the present disclosure may perform a program operation of a selected memory cell, a program operation of a memory cell adjacent to the selected memory cell, and an erase operation of the selected memory cell and the adjacent memory cell.

The memory cell array 100 may include a plurality of memory blocks MB1 to MBk 110 (k is a positive integer). Local lines LL and bit lines BL1 to BLn (n is a positive integer) may be connected to each of the memory blocks MB1 to MBk 110. For example, the local lines LL may include a first select line, a second select line, and a plurality of word lines arranged between the first and second select lines. Also, the local lines LL may include dummy lines arranged between the first select line and the word lines, and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be connected to each of the memory blocks MB1 to MBk 110, and the bit lines BL1 to BLn may be commonly connected to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be stacked in a direction vertical to a substrate in memory blocks 110 having a three-dimensional structure.

The peripheral circuits 200 may perform program, read, and erase operations of a selected memory block 110 under the control of the control logic 300. For example, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a read voltage, a verify voltage, a pass voltage, and a select transistor operating voltage.

The row decoder 220 may transfer the operating voltages Vop to the local lines LL connected to the selected memory block 110 in response to row decoder control signals AD_signals. For example, the row decoder 220 may selectively apply operating voltages (e.g., a program voltage, a read voltage, a verify voltage, a pass voltage, and the like) generated by the voltage generating circuit 210 to the local lines LL or float some lines (e.g., a word line and a source select line) among the local lines LL, in response to the row decoder control signals AD_signals.

The page buffer group 230 may include a plurality of page buffers PB1 to PBm 231 connected to the bit lines BL1 to BLn. The page buffers PB1 to PBm 231 may operate in response to page buffer control signals PBSIGNALS. For example, the page buffers PB1 to PBm 231 may control the bit lines BL1 to BLn in a floating state in an erase voltage apply operation during an erase operation, and sense a current or potential level of the bit lines BL1 to BLn in an erase verify operation.

The column decoder 240 may transfer data between the input/output circuit 250 and the page buffer group 230 in response to a column address CADD. For example, the column decoder 240 may exchange data with the page buffers 231 through the data lines DL, or exchange data with the input/output circuit 250 through column lines CL.

The input/output circuit 250 may transfer a command CMD and an address ADD, which are transferred from the memory controller (1200 shown in FIG. 1) to the control logic 300, or exchange data DATA with the column decoder 240.

In a read operation or a verify operation, the pass/fail check circuit 260 may generate a reference current in response to an allow bit VRY_BIT<#>, and output a pass signal PASS or a fail signal FAIL by comparing a sensing voltage VPB received from the page buffer group 230 with a reference voltage generated by the reference current.

The source line driver 270 may be connected to a memory cell included in the memory cell array 100 through a source line SL, and control a voltage applied to the source line SL. The source line driver 270 may generate an erase voltage in an erase operation and apply the erase voltage to the source line of the memory cell array 100.

The source line driver 270 may receive a source line control signal CTRL_SL from the control logic 300, and control a source line voltage applied to the source line SL, based on the source line control signal CTRL_SL.

The control logic 300 may control the peripheral circuits 200 by outputting the operation signal OP_CMD, the row decoder control signals AD_signals, the page buffer control signals PBSIGNALS, and the allow bit VRY_BIT<#> in response to the command CMD and the address ADD. Also, the control logic 300 may determine whether a verify operation has passed or failed in response to the pass or fail signal PASS or FAIL.

Figure 3:
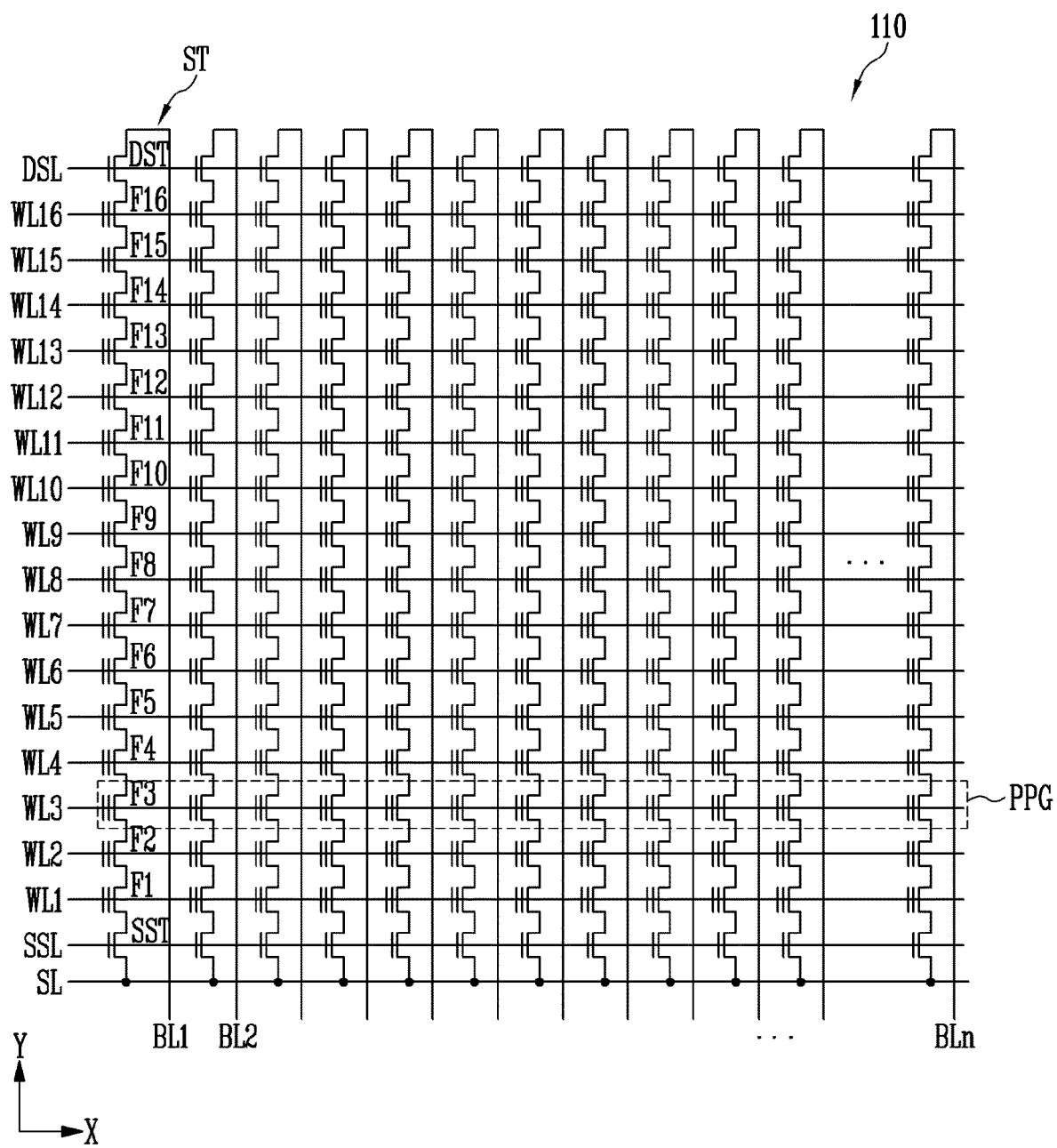
FIG. 3 is a diagram illustrating a memory block shown in FIG. 2.

FIG. 3 is a diagram illustrating the memory block shown in FIG. 2.

Referring to FIG. 3, in the memory block 110, a plurality of word lines arranged in parallel to one another may be connected between a first select line and a second select line. The first select line may be a source select line SSL, and the second select line may be a drain select line DSL. More specifically, the memory block 110 may include a plurality of strings ST connected between bit lines BL1 to BLn and a source line SL. The bit lines BL1 to BLn may be connected to the strings ST, respectively, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series between the source line SL and the first bit line BL1. At least one source select transistor SST and at least one drain select transistor DST may be included in one string ST, and memory cells having a number which is greater than the number of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, gates of drain select transistors DST included in different strings ST may be connected to the drain select line DSL, and gates of memory cells F1 to F16 included in different strings ST may be connected to a plurality of word lines WL1 to WL16. A group of memory cells connected to the same word line among memory cells included in different strings ST may be referred as a page PPG. Therefore, a number of pages PPG which corresponds to a number of the word lines WL1 to WL16 may be included in the memory block 110.

One memory cell may store data of one bit. The memory cell is generally referred to as a single level cell (SLC). Therefore, one physical page PPG may store one logical page (LPG) data. One LPG data may include data bits corresponding to a number of cells included in one physical page PPG. In addition, one memory cell may store data of two or more bits. The memory cell is generally referred to as a multi-level cell (MLC). Therefore, one physical page PPG may store two or more LPG data.

Figure 4:
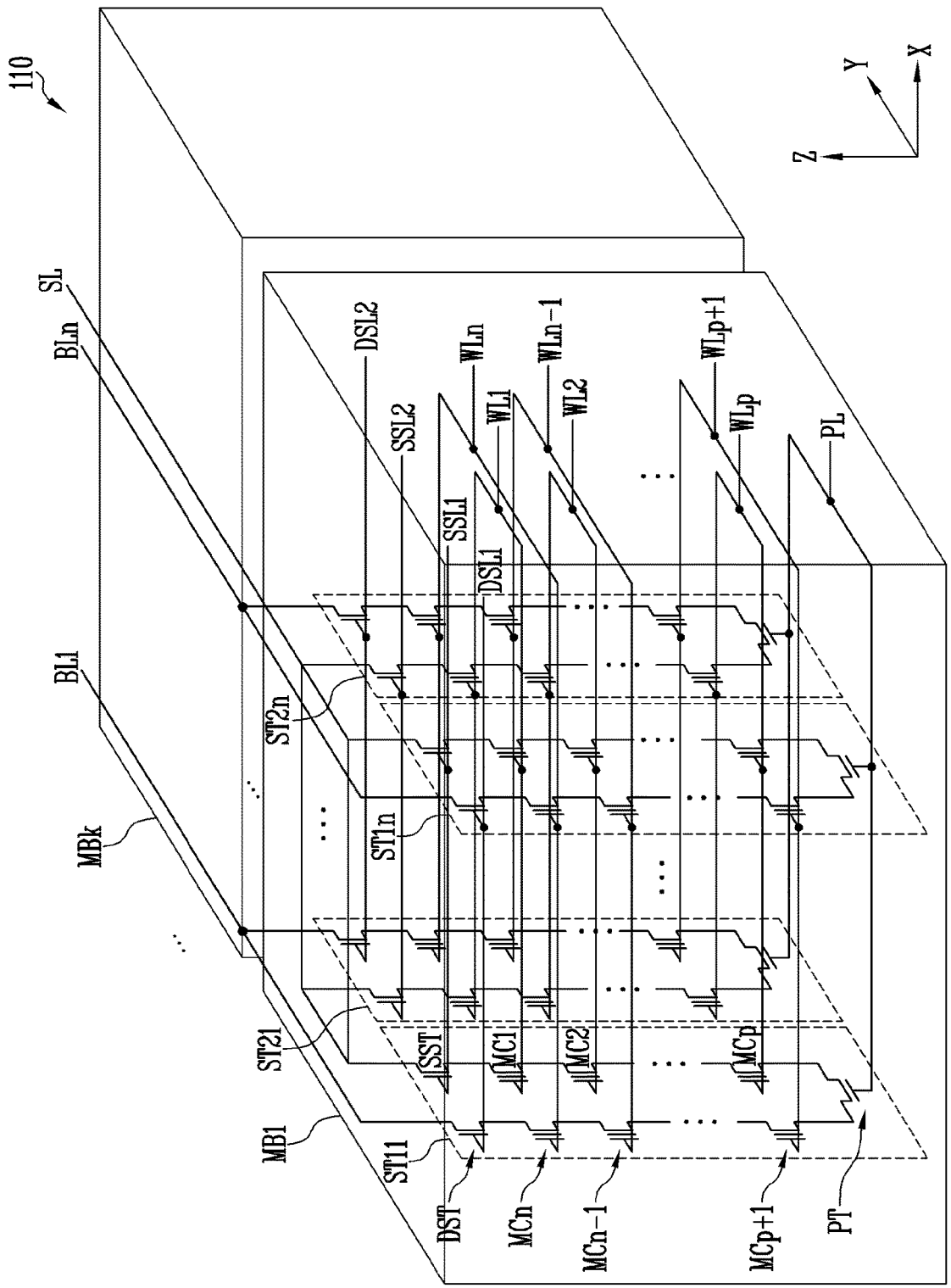
FIG. 4 is a diagram illustrating an embodiment of a three-dimensionally configured memory block.

FIG. 4 is a diagram illustrating an embodiment of a three-dimensionally configured memory block.

Referring to FIG. 4, the memory cell array 100 may include a plurality of memory blocks MB1 to MBk 110. The memory block 110 may include a plurality of strings ST11 to ST1n and ST21 to ST2n. In an embodiment, each of the plurality of strings ST11 to ST1n and ST21 to ST2n may be formed in a 'U' shape. In a first memory block MB1, m strings may be arranged in a row direction (X direction). Although a case where two strings are arranged in a column direction (Y direction) is illustrated in FIG. 4, this is for convenience of description, and three or more strings may be arranged in the column direction (Y direction).

Each of the plurality of strings ST11 to ST1n and ST21 to ST2n may include at least one source select transistor SST, first to nth memory cells MC1 to MCn, a pipe transistor PT, and at least one drain select transistor DST.

The source and drain select transistors SST and DST, and the memory cells MC1 to MCn may have structures similar to one another. For example, each of the source and drain select transistors SST and DST and the memory cells MC1 to MCn may include a channel layer, a tunnel insulating layer, a charge storage layer, and a blocking insulating layer. For example, a pillar for providing the channel layer may be provided in each string. For example, a pillar for providing at least one of the channel layer, the tunnel insulating layer, the charge storage layer, and the blocking insulating layer may be provided in each string.

The source select transistor SST of each string may be connected between a source line SL and memory cells MC1 to MCp.

In an embodiment, source select transistors of strings arranged on the same row may be connected to a source select line extending in the row direction, and source select transistors of strings arranged in different rows may be connected to different source select lines. In FIG. 4, source select transistors of strings ST11 to ST1n of a first row may be connected to a first source select line SSL1. Source select transistors of strings ST21 to ST2n of a second row may be connected to a second source select line SSL2.

In another embodiment, the source select transistors of the strings ST11 to ST1n and ST21 to ST2n may be commonly connected to one source select line.

The first to nth memory cells MC1 to MCn of each string may be connected between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (Z direction), and be connected in series to each other between the source select transistor SST and the pipe transistor PT. The (p+1)th to nth memory cells MCp+1 to MCn may be sequentially arranged in the vertical direction (Z direction), and be connected in series to each other between the pipe transistor PT and the drain select transistor DST. The first to pth memory cells MC1 to MCp and the (p+1)th to nth memory cells MCp+1 to MCn may be connected to each other through the pipe transistor PT. Gates of the first to nth memory cells MC1 to MCn of each string may be connected to first to nth word lines WL1 to WLn, respectively.

In an embodiment, at least one of the first to nth memory cells MC1 to MCn may be used as a dummy memory cell. When the dummy memory cell is provided, a voltage or current of a corresponding string can be stably controlled. A gate of the pipe transistor PT of each string may be connected to the pipe line PL.

The drain select transistor DST of each string may be connected to a bit line and the memory cells MCp+1 to MCn. Strings arranged in the row direction may be connected to a drain select line extending in the row direction. Drain select transistors of the strings ST11 to ST1n on the first row may be connected to a first drain select line DSL1. Drain select transistors of the strings ST21 to ST2n on the second row may be connected to a second drain select line DSL2.

Strings arranged in the column direction may be connected to bit lines extending in the column direction. In FIG. 4, strings ST11 and ST21 of a first column may be connected to a first bit line BL1. Strings ST1m and ST2n of an nth column may be connected to an nth bit line BLn.

Memory cells connected to the same word line among the strings arranged in the row direction may constitute one page. For example, memory cells connected to the first word line WL1 among the strings ST11 to ST1n of the first row may constitute one page. Memory cells connected to the first word line WL1 among the strings ST21 to ST2n of the second row may constitute another page. When one of the drain select lines DSL1 and DSL2 is selected, strings arranged in one row direction may be selected. When one of the word lines WL1 to WLn is selected, one page among the selected strings may be selected.

Figure 5:
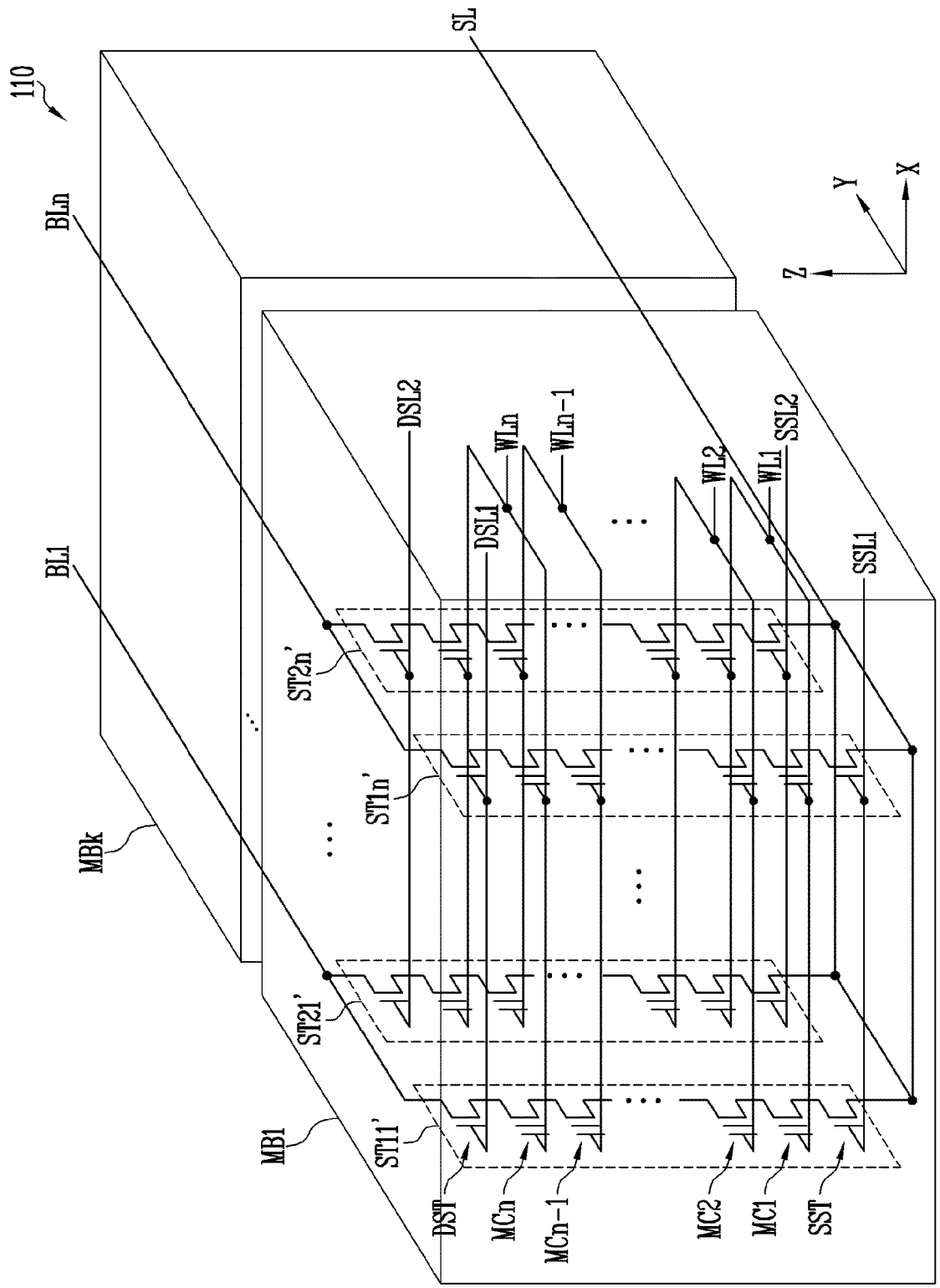
FIG. 5 is a diagram illustrating another embodiment of the three-dimensionally configured memory block.

FIG. 5 is a diagram illustrating another embodiment of the three-dimensionally configured memory block.

Referring to FIG. 5, the memory cell array 100 may include a plurality of memory blocks MB1 to MBk 110. The memory block 110 may include a plurality of strings ST11' to ST1n' and ST21' to ST2n'. Each of the plurality of strings ST11' to ST1n' and ST21' to ST2n' may extend along a vertical direction (Z direction). In the memory block 110, n strings may be arranged in a row direction (X direction). Although a case where two strings are arranged in a column direction (Y direction) is illustrated in FIG. 5, this is for convenience of description, and three or more strings may be arranged in the column direction (Y direction).

Each of the plurality of strings ST11' to ST1n' and ST21' to ST2n' may include at least one source select transistor SST, first to nth memory cells MC1 to MCn, and at least one drain select transistor DST.

The source select transistor SST of each string may be connected between a source line SL and the memory cells MC1 to MCn. Source select transistors of strings arranged in the same row may be connected to the same source select line. Source select transistors of strings ST11' to ST1n' arranged on a first row may be connected to a first source select line SSL1. Source select transistors of strings ST21' to ST2n' arranged on a second row may be connected to a second source select line SSL2. In another embodiment, the source select transistors of the strings ST11' to ST1n' and ST21' to ST2n' may be commonly connected to one source select line.

The first to nth memory cells MC1 to MCn of each string may be connected in series between the source select transistor SST and the drain select transistor DST. Gates of the first to nth memory cells MC1 to MCn may be connected to first to nth word lines WL1 to WLn, respectively.

In an embodiment, at least one of the first to nth memory cells MC1 to MCn may be used as a dummy memory cell. When the dummy memory cell is provided, a voltage or current of a corresponding string can be stably controlled. Accordingly, the reliability of data stored in the memory block 110 can be improved.

The drain select transistor DST of each string may be connected between a bit line and the memory cells MC1 to MCn. Drain select transistors DST of strings arranged in the row direction may be connected to a drain select line extending in the row direction. The drain select transistors DST of the strings ST11' to ST1n' of the first row may be connected to a first drain select line DSL1. The drain select transistors DST of the strings ST21' to ST2n' of the second row may be connected to a second drain select line DSL2.

That is, the memory block 110 shown in FIG. 5 may have a circuit similar to that of the memory block 110 shown in FIG. 4, except that the pipe transistor PT is excluded from each string.

The plurality of memory blocks MB1 to MBk 110 described in FIGS. 4 and 5 may share the source line SL.

Figure 6:
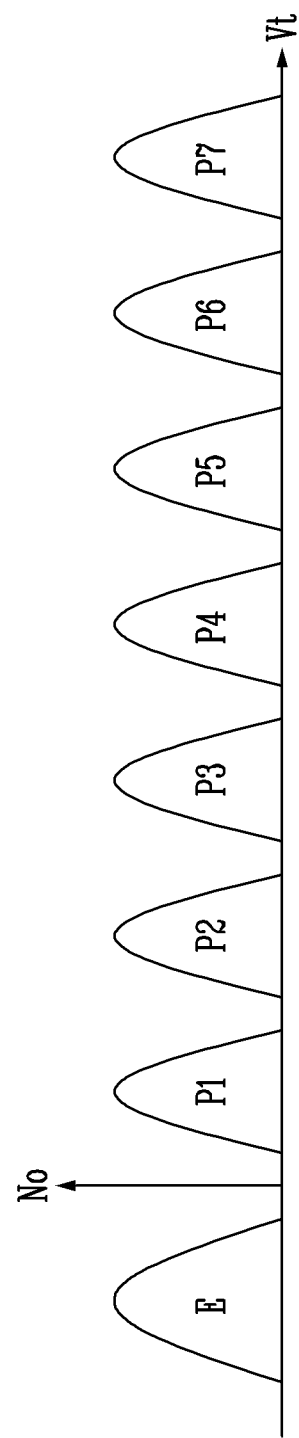
FIG. 6 is a threshold voltage distribution diagram illustrating a threshold voltage distribution according to a program state of memory cells included in a memory block.

FIG. 6 is a threshold voltage distribution diagram illustrating a threshold voltage distribution according to a program state of memory cells included in a memory block.

In the embodiment of the present disclosure, a program state of a triple-level cell (TLC) when a number of threshold voltage distributions of memory cells is eight (PV0 to PV7) will be described as an example.

Referring to FIG. 6, the memory cells may be programmed to an erase state E to a plurality of program states P1 to P7. The memory cells included in the memory block before a program operation is performed may have a threshold voltage of the erase state E.

In the program operation, each of the memory cells in the erase state E may maintain the erase state E or be programmed to one program state among the plurality of program states P1 to P7. The erase state E and the plurality of program states P1 to P7 may correspond to data which the memory cell can store.

In an embodiment of the present disclosure, a case where the memory cells are programmed as TLCs, of which number of threshold voltage distributions is eight, has been described. However, the present disclosure is not limited thereto, and the memory cells may be programmed as single-level cells (SLCs), of which number of threshold voltage distributions is two, multi-level cells (MLCs), of which number of threshold voltage distributions is four, or quad-level cells (QLCs), of which number of threshold voltage distributions is sixteenth.

Figure 7:
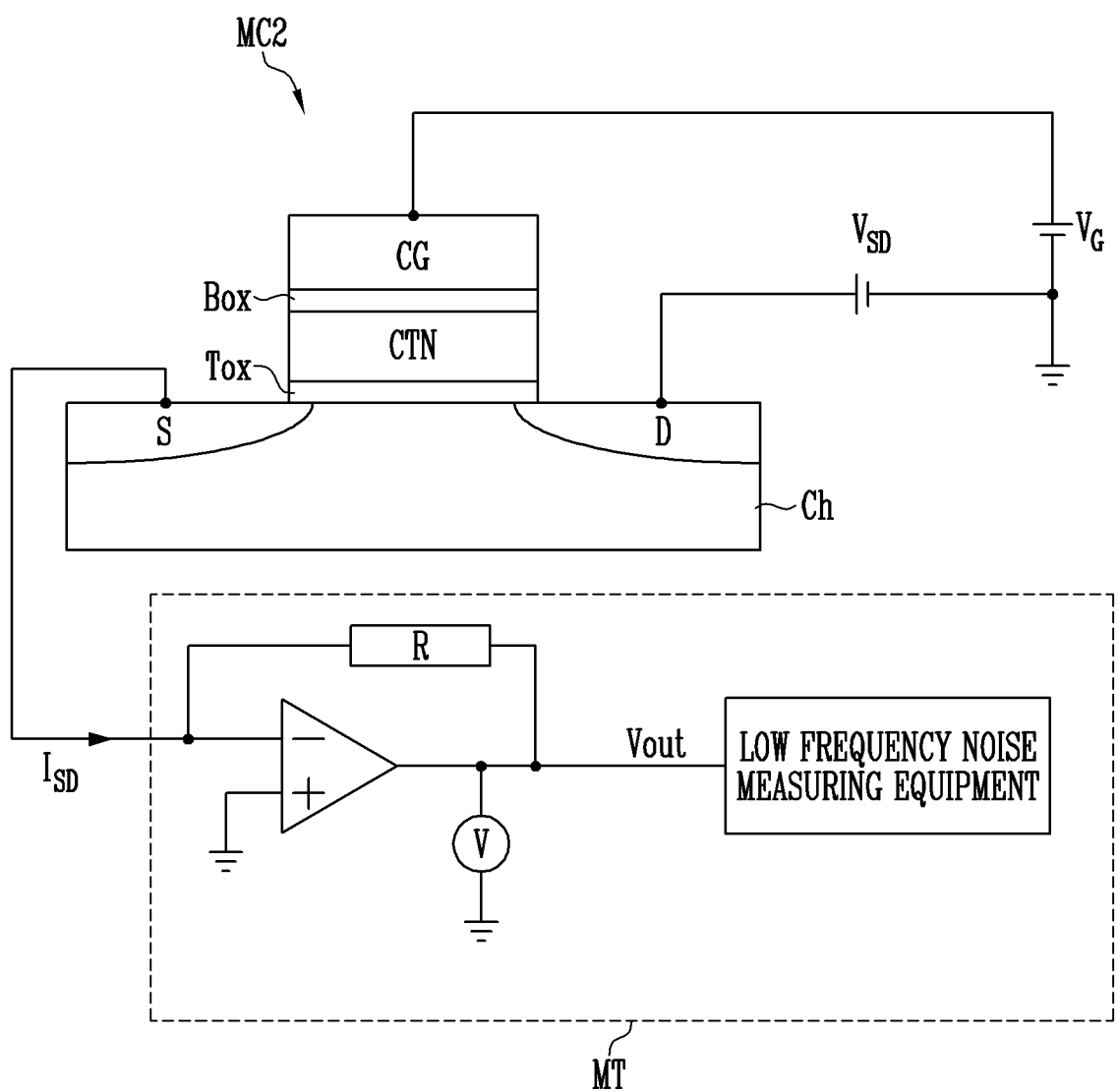
FIG. 7 is a diagram illustrating a method for measuring interference on a memory cell in accordance with an embodiment of the present disclosure.

FIG. 7 is a diagram illustrating a method for measuring interference on a memory cell in accordance with an embodiment of the present disclosure.

Referring to FIG. 7, the memory cell MC2 may have a structure in which a stack structure including a tunnel insulating layer Tox, a charge storage layer CTN, a blocking insulating layer Box, and a control gate CG is formed on a channel layer Ch. In addition, the channel layer Ch adjacent to the stack structure may be defined with a source region S and a drain region D.

The method for measuring interference on the memory cell MC2 may be performed by using a measuring apparatus MT. The measuring apparatus MT may convert a cell current $I_{SD}$ flowing from the drain region D to the source region S of the memory cell MC2 into an output voltage Vout, and measure a low frequency noise of the output voltage Vout. For example, the measuring apparatus MT may convert the cell current $I_{SD}$ into the output voltage Vout by using a resistor R, and measure the low frequency noise of the output voltage Vout by using a low frequency noise measuring equipment.

Ideally, in the memory cell, the cell current $I_{SD}$ flowing from the drain region D to the source region S is constant when a measurement voltage (inter-drain-source voltage $V_{SD}$) is applied to the drain region D in a state in which a gate voltage $V_G$ is applied to the control gate CG. However, in a program operation of the memory cell, the cell current $I_{SD}$ is changed according to a quantity of charges trapped in the charge storage layer CTN, positions of the charges trapped in the charge storage layer CTN, and interference influence caused by adjacent memory cells, and a low frequency noise of the output voltage Vout occurs. Accordingly, a low frequency noise of the memory cell is measured, so that a quantity of charges trapped in the charge storage layer CTN, positions of the charges trapped in the charge storage layer CTN, and interference influence caused by adjacent memory cells can be quantified.

Figure 8:
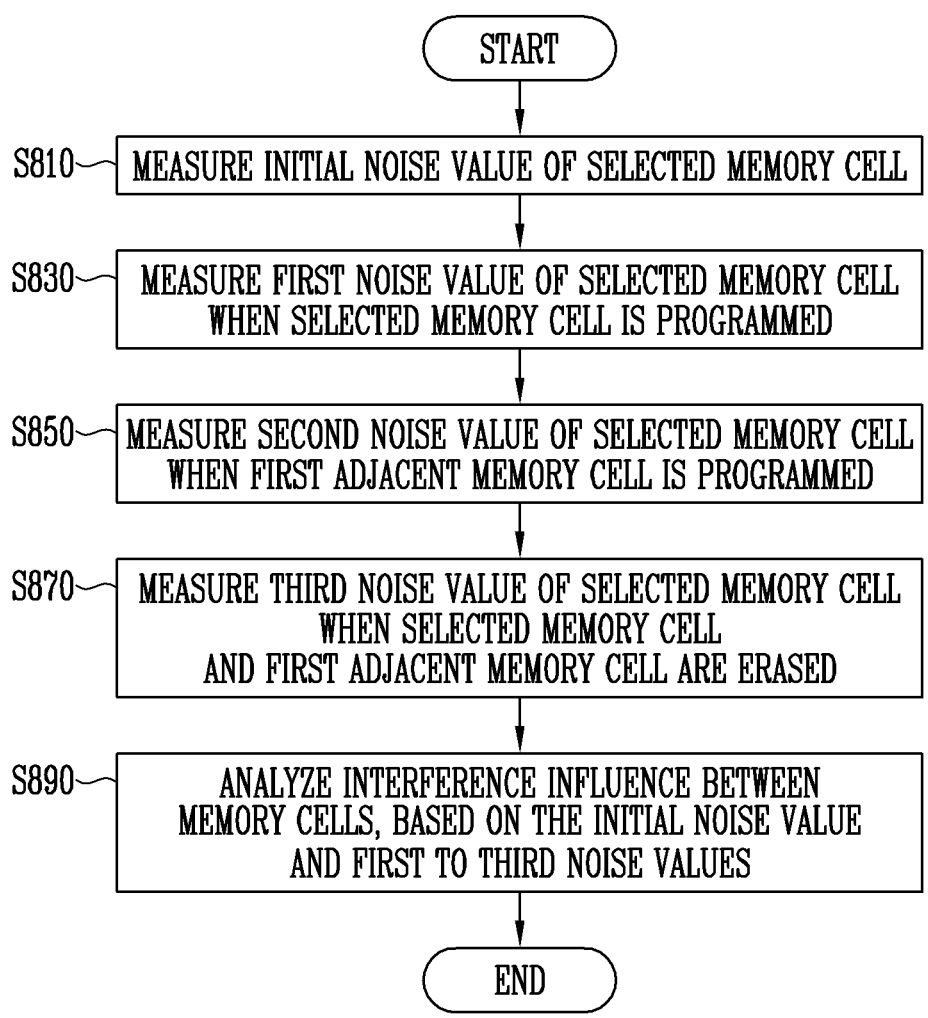
FIG. 8 is a flowchart illustrating a method for measuring interference on a memory cell in accordance with an embodiment of the present disclosure.

FIG. 8 is a flowchart illustrating a method for measuring interference on a memory cell in accordance with an embodiment of the present disclosure.

Figure 9:
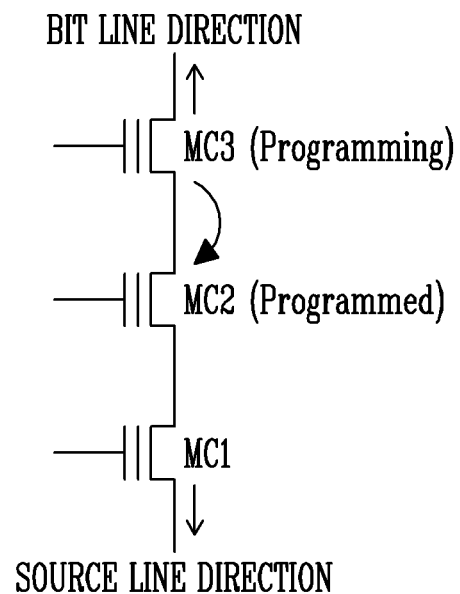
FIG. 9 is a diagram illustrating an adjacent relationship between memory cells in accordance with an embodiment of the present disclosure.

FIG. 9 is a diagram illustrating an adjacent relationship between memory cells in accordance with an embodiment of the present disclosure.

A method for measuring interference on a memory cell in accordance with an embodiment of the present disclosure will be described as follows with reference to FIGS. 2 and 5 to 9.

In the embodiment of the present disclosure, the memory cell MC2 is a selected memory cell, and a memory cell MC1 and a memory cell MC3 are defined as memory cells adjacent to the selected memory cell MC2. The memory cell MC1 is a memory cell adjacent to the memory cell MC2 in a source line direction, and the memory cell MC3 is a memory cell adjacent to the memory cell MC2 in a bit line direction.

In the embodiment of the present disclosure, a case where interference on the selected memory cell programmed by a program operation of a memory cell adjacent to the selected memory cell is measured will be described as an example.

In operation S810, an initial noise value of the selected memory cell MC2 is measured. The selected memory cell MC2 and the adjacent memory cells MC1 and MC3 may be in the erase state E.

In operation S830, the selected memory cell MC2 is programmed to one program state (e.g., P1) among the plurality of program states P1 to P7. After a program operation of the selected memory cell MC2 is completed, a first noise value of the selected memory cell MC2 is measured.

In operation S850, a first adjacent memory cell (e.g., MC3) selected from the adjacent memory cells MC1 and MC3 is programmed to one program state (e.g., P1) among the plurality of program states P1 to P7. After a program operation of the first adjacent memory cell MC3 is completed, a second noise value of the selected memory cell MC2 is measured.

In operation S870, an erase operation is performed on the selected memory cell MC2 and the first adjacent memory cell MC3, which are in the program state. After the erase operation is completed, a third noise value of the selected memory cell MC2 is measured.

In operation S890, interference on the selected memory cell MC2 is analyzed based on the initial noise value and the first to third noise values of the selected memory cell MC2, which are respectively measured in the above-described operations S810, S830, S850, and S870.

For example, a charge trap quantity and a trap position (depth) of the charge storage layer in which electrons are trapped in the program operation of the selected memory cell MC2 may be calculated by using a variation of the initial noise value and the first noise value. In addition, interference on the selected memory cell MC2, which is caused by the program operation of the adjacent memory cell MC3, may be calculated by using a variation of the first noise value and a second noise value, and a quantity of charges remaining in the charge storage layer and a trap position of the charge storage layer after the erase operation may be calculated by using the initial noise value and the third noise value.

Figure 10:
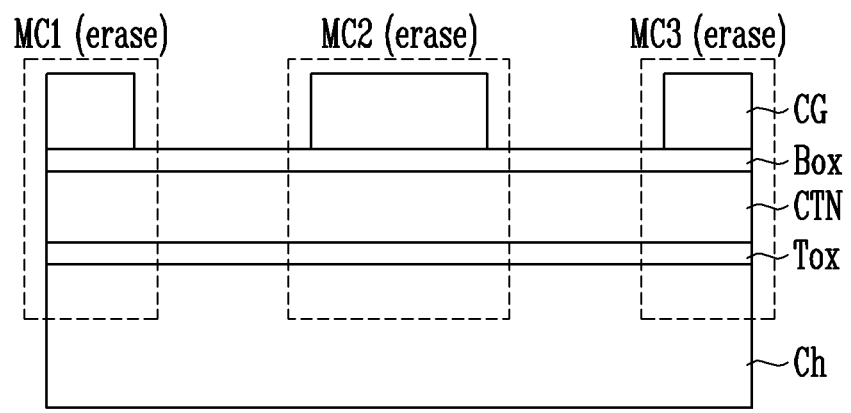
FIG. 10 is a sectional view of memory cells, illustrating operation S810 shown in FIG. 8.

FIG. 10 is a sectional view of the memory cells, illustrating the operation S810 shown in FIG. 8.

Figures 11, 12, 13:
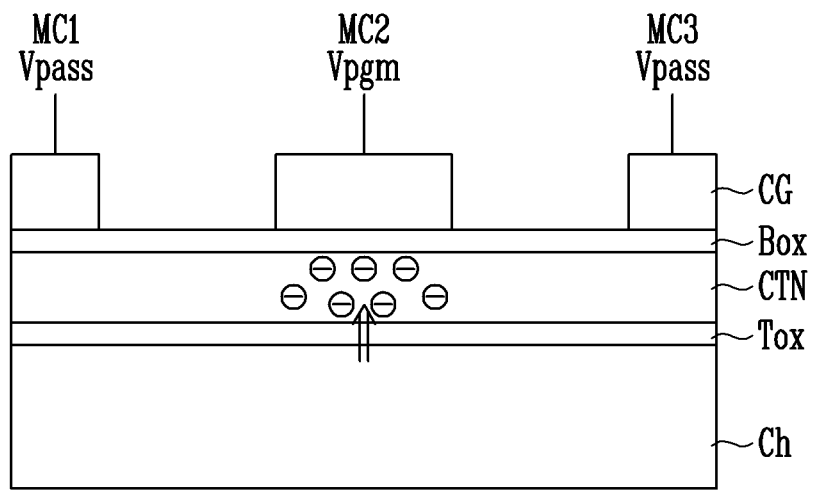
FIG. 11 is a diagram illustrating voltages applied to the memory cells when an initial noise value is measured in the operation S810 shown in FIG. 8.
FIG. 12 is a sectional view of the memory cells, illustrating operation S830 shown in FIG. 8.
FIG. 13 is a diagram illustrating voltages applied to the memory cells in a program operation of a selected memory cell in the operation S830 shown in FIG. 8.

FIG. 11 is a diagram illustrating voltages applied to the memory cells when the initial noise value is measured in the operation S810 shown in FIG. 8.

Referring to FIGS. 10 and 11, in the operation of measuring the initial noise value, the memory device 1100 applies a pass voltage Vpass to word lines of the selected memory cell MC2 and the memory cells MC1 and MC3 adjacent to the selected memory cell MC2 among a plurality of memory cells included in a selected memory block (e.g., MB1). Also, the memory device 1100 may apply a constant voltage (e.g., Vcc) to a bit line (e.g., BL1).

The measuring apparatus MT measures the initial noise value of the selected memory cell MC2 by using the cell current $I_{SD}$ of the selected memory cell MC2.

FIG. 12 is a sectional view of the memory cells, illustrating the operation S830 shown in FIG. 8.

FIG. 13 is a diagram illustrating voltages applied to the memory cells in the program operation of the selected memory cell in the operation S830 shown in FIG. 8.

Referring to FIGS. 12 and 13, in the program operation of the selected memory cell MC2, the program operation of the selected memory cell MC2 is performed by applying a program voltage Vpgm to the word line of the selected memory cell MC2. Therefore, electrons of the channel layer CH are introduced and trapped in the charge storage layer CTN of the selected memory cell MC2. The pass voltage Vpass is applied to the word lines of the adjacent memory cells MC1 and MC3.

When the program operation of the selected memory cell MC2 is completed, an operation of measuring the first noise value is performed. The operation of measuring the first noise value may be performed similarly to the above-described operation of measuring the initial noise value. For example, in the operation of measuring the first noise value, the memory device 1100 applies the pass voltage Vpass to the word lines of the selected memory cell MC2 and the memory cells MC1 and MC3 adjacent to the selected memory cells MC2 among a plurality of memory cells included in a selected memory block (e.g., MB1). Also, the memory device 1100 may apply a constant voltage (e.g., Vcc) to a bit line (e.g., BL1).

The measuring apparatus MT measures the first noise value of the selected memory cell MC2 by using the cell current $I_{SD}$ of the selected memory cell MC2.

FIG. 14 is a sectional view of the memory cells, illustrating the operation S850 shown in FIG. 8.

FIG. 15 is a diagram illustrating voltages applied to the memory cells in the program operation of the adjacent memory cells in the operation S850 shown in FIG. 8.

Referring to FIGS. 14 and 15, in the program operation of the first adjacent memory cell MC3, the program operation of the first adjacent memory cell MC3 is performed by applying the program voltage Vpgm to the word line of the first adjacent memory cell MC3. Therefore, electrons of the channel layer Ch are introduced and trapped in the charge storage layer CTN of the first adjacent memory cell MC3. The pass voltage Vpass is applied to the word lines of the selected memory cell MC2 and the second adjacent memory cell MC1.

When the program operation of the first adjacent memory cell MC3 is completed, an operation of measuring the second noise value is performed. The operation of measuring the second noise value may be performed similarly to the above-described operation of measuring the first noise value. For example, in the operation of measuring the second noise value, the memory device 1100 applies the pass voltage Vpass to the word lines of the selected memory cell MC2 and the memory cells MC1 and MC3 adjacent to the selected memory cells MC2 among a plurality of memory cells included in a selected memory block (e.g., MB1). Also, the memory device 1100 may apply a constant voltage (e.g., Vcc) to a bit line (e.g., BL1).

The measuring apparatus MT measures the second noise value of the selected memory cell MC2 by using the cell current $I_{SD}$ of the selected memory cell MC2.

Figures 16, 17:
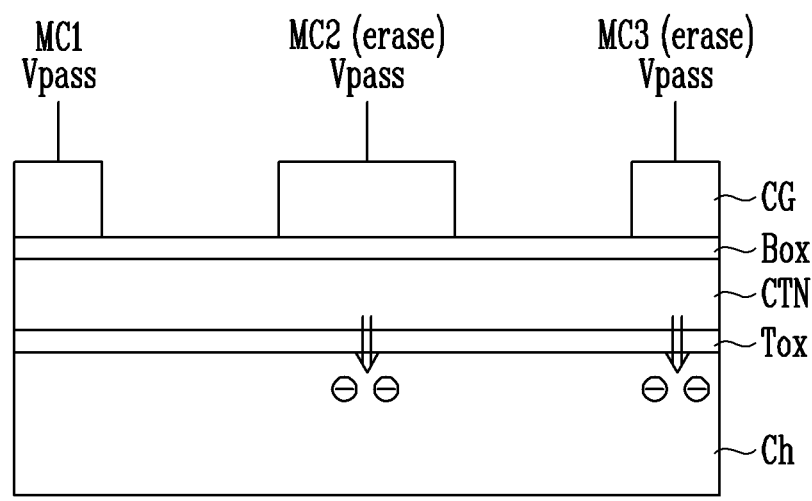
FIG. 16 is a sectional view of the memory cells, illustrating operation S870 shown in FIG. 8.
FIG. 17 is a diagram illustrating voltages applied to the memory cells when a third noise value is measured in the operation S870 shown in FIG. 8.

FIG. 16 is a sectional view of the memory cells, illustrating the operation S870 shown in FIG. 8.

FIG. 17 is a diagram illustrating voltages applied to the memory cells when the third noise value is measured in the operation S870 shown in FIG. 8.

Referring to FIGS. 16 and 17, in the erase operation, electrons trapped in the charge storage layer CTN of the selected memory cell MC2 and the first adjacent memory cell MC3 are detrapped to be disposed to the channel layer Ch.

When the third noise value is measured, the memory device 1100 applies the pass voltage Vpass to the word lines of the selected memory cell MC2 and the memory cells MC1 and MC3 adjacent to the selected memory cells MC2 among a plurality of memory cells included in a selected memory block (e.g., MB1). Also, the memory device 1100 may apply a constant voltage (e.g., Vcc) to a bit line (e.g., BL1).

The measuring apparatus MT measures the third noise value of the selected memory cell MC2 by using the cell current $I_{SD}$ of the selected memory cell MC2.

In the above-described embodiment of the present disclosure, a case where the selected memory cell and the first adjacent memory cell are programmed to one program state P1 has been described. However, the selected memory cell may be programmed to one of the plurality of program states P1 to P7, and an interference measurement operation may be performed for each of the plurality of program states P1 to P7 of the first adjacent memory cell. That is, the interference on the memory cells can be analyzed in more detail by performing the interference measurement operation according to the program state of the selected memory cell and each of the program states of the first adjacent memory cell.

Figure 18:
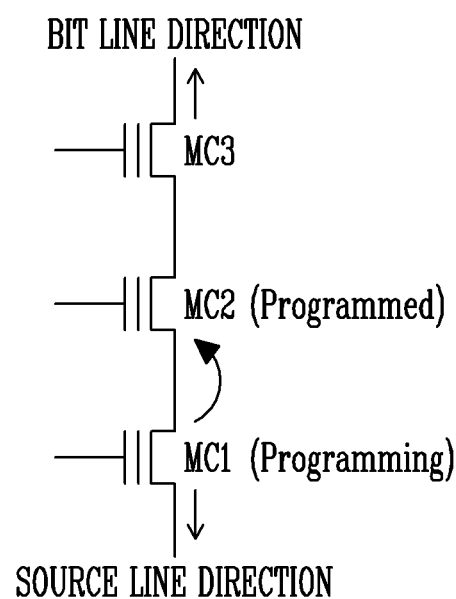
FIG. 18 is a diagram illustrating an adjacent relationship between memory cells in accordance with another embodiment of the present disclosure.

FIG. 18 is a diagram illustrating an adjacent relationship between memory cells in accordance with another embodiment of the present disclosure.

In the above-described embodiment of the present disclosure, it has been described that the first adjacent memory cell is defined as a memory cell adjacent to the selected memory cell in a bit line direction, and interference on the selected memory cell, which is caused by a program operation of the memory cell adjacent in the bit line direct is measured. However, as shown in FIG. 18, the memory cell MC1 adjacent to the selected memory cell MC2 in a source line direction may be defined as a first adjacent memory cell, and interference on the selected memory cell MC2, which is caused by a program operation of the memory cell MC1 adjacent in the source line direction, may be measured.

A method of measuring the interference on the selected memory cell MC2, which is caused by a program operation of the memory cell MC1 adjacent in the source line direction, may include the steps of measuring the initial noise value and the first to third noise values, which are described in FIGS. 8 to 17.

Figure 19:
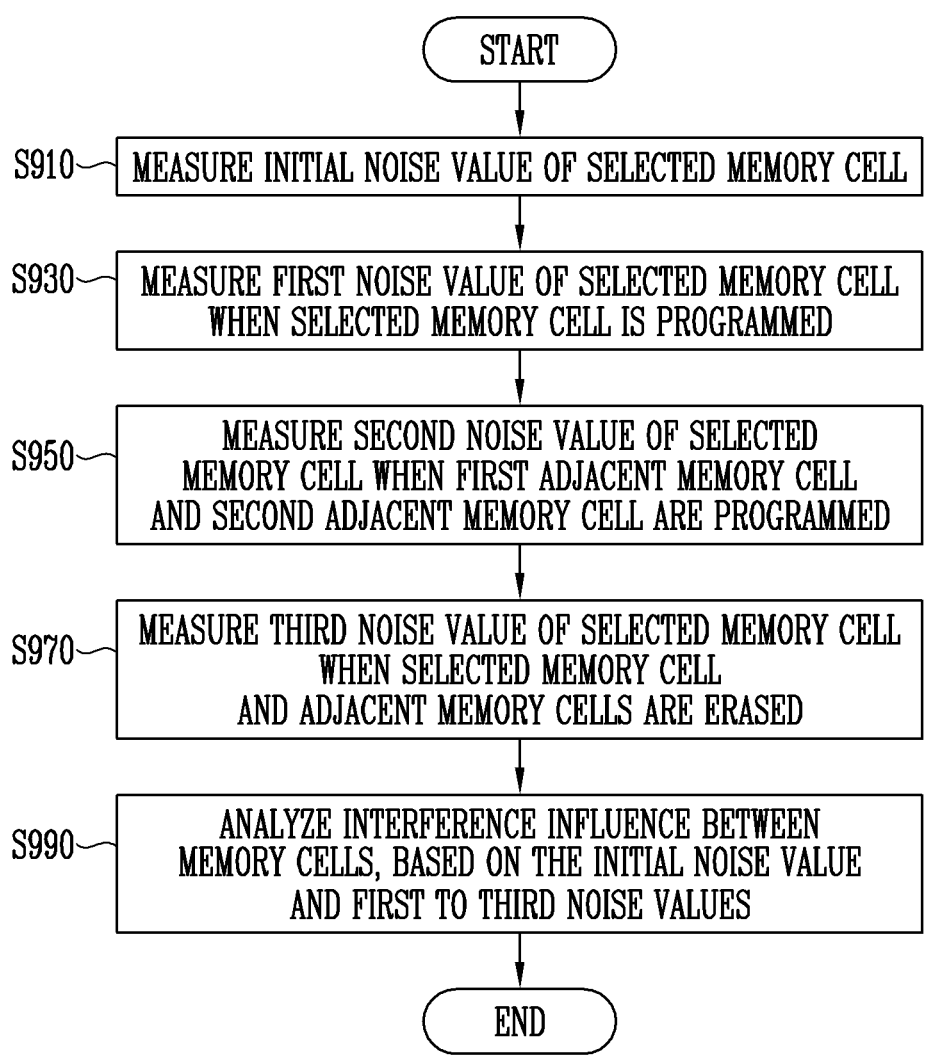
FIG. 19 is a flowchart illustrating a method for measuring interference on a memory cell in accordance with another embodiment of the present disclosure.

FIG. 19 is a flowchart illustrating a method for measuring interference on a memory cell in accordance with another embodiment of the present disclosure.

Figure 20:
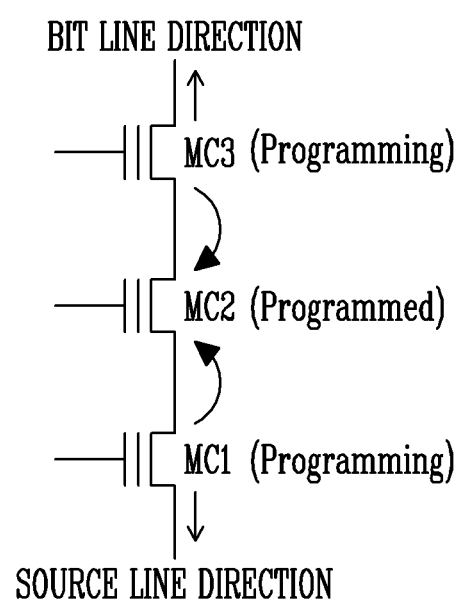
FIG. 20 is a diagram illustrating an adjacent relationship between memory cells in accordance with another embodiment of the present disclosure.

FIG. 20 is a diagram illustrating an adjacent relationship between memory cells in accordance with another embodiment of the present disclosure.

A method for measuring interference on a memory cell in accordance with another embodiment of the present disclosure will be described as follows with reference to FIGS. 2, 5 to 7, 19, and 20.

In the another embodiment of the present disclosure, the memory cell MC2 is a selected memory cell, and a memory cell MC1 and a memory cell MC3 are defined as memory cells adjacent to the selected memory cell MC2. For example, a first adjacent memory cell MC1 is a memory cell adjacent to the memory cell MC2 in a source line direction, and a second adjacent memory cell MC3 is a memory cell adjacent to the memory cell MC2 in a bit line direction.

In another embodiment of the present disclosure, a case where interference on the selected memory cell programmed by a program operation of a plurality of memory cells adjacent to the selected memory cell is measured will be described as an example.

In operation S910, an initial noise value of the selected memory cell MC2 is measured. The selected memory cell MC2 and the adjacent memory cells MC1 and MC3 may be in the erase state E.

In operation S930, the selected memory cell MC2 is programmed to one program state (e.g., P1) among the plurality of program states P1 to P7. After a program operation of the selected memory cell MC2 is completed, a first noise value of the selected memory cell MC2 is measured.

In operation S950, the first adjacent memory cell MC1 and the second adjacent memory cell MC3 are programmed to one program state (e.g., P1) among the plurality of program states P1 to P7. After a program operation of the first adjacent memory cell MC1 and the second adjacent memory cell MC3 is completed, a second noise value of the selected memory cell MC2 is measured.

In operation S970, an erase operation is performed on the selected memory cell MC2 and the first and second adjacent memory cells MC1 and MC2, which are in the program state. After the erase operation is completed, a third noise value of the selected memory cell MC2 is measured.

In operation S990, interference on the selected memory cell MC2 is analyzed based on the initial noise value and the first to third noise values of the selected memory cell MC2, which are respectively measured in the above-described operations S910, S930, S950, and S970.

For example, a charge trap quantity and a trap position (depth) of the charge storage layer in which electrons are trapped in the program operation of the selected memory cell MC2 may be calculated by using a variation of the initial noise value and the first noise value. In addition, interference on the selected memory cell MC2, which is caused by the program operation of the adjacent memory cells MC1 and MC3, may be calculated by using a variation of the first noise value and the second noise value, and a quantity of charges remaining in the charge storage layer and a trap position of the charge storage layer after the erase operation may be calculated by using the initial noise value and the third noise value.

As described above, in accordance with the another embodiment of the present disclosure, interference influence on a selected memory cell according to a program operation of at least adjacent memory cells adjacent to the selected memory cell in the bit line direction and the source line direction can be analyzed.

Figures 21, 22:
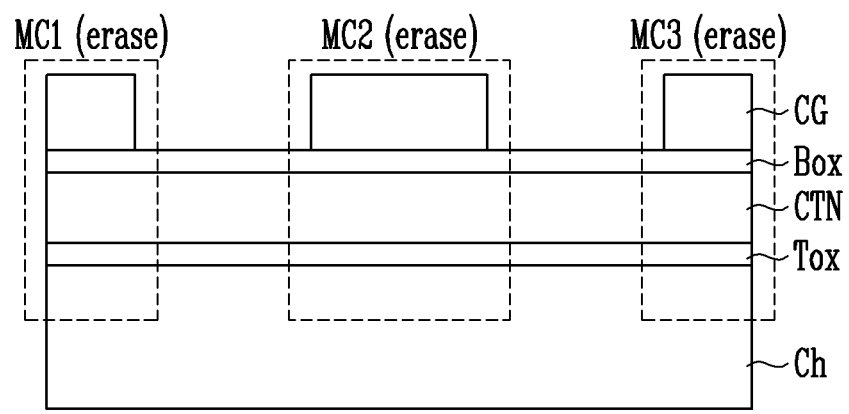
FIG. 21 is a sectional view of memory cells, illustrating operation S910 shown in FIG. 19.
FIG. 22 is a diagram illustrating voltages applied to the memory cells when an initial noise value is measured in the operation S910 shown in FIG. 19.

FIG. 21 is a sectional view of the memory cells, illustrating the operation S910 shown in FIG. 19.

FIG. 22 is a diagram illustrating voltages applied to the memory cells when the initial noise value is measured in the operation S910 shown in FIG. 19.

Referring to FIGS. 21 and 22, in the operation of measuring the initial noise value, the memory device 1100 applies a pass voltage Vpass to word lines of the selected memory cell MC2 and the first and second adjacent memory cells MC1 and MC3 adjacent to the selected memory cell MC2 among a plurality of memory cells included in a selected memory block (e.g., MB1). Also, the memory device 1100 may apply a constant voltage (e.g., Vcc) to a bit line (e.g., BL1).

The measuring apparatus MT measures the initial noise value of the selected memory cell MC2 by using the cell current $I_{SD}$ of the selected memory cell MC2.

Figures 23, 24:
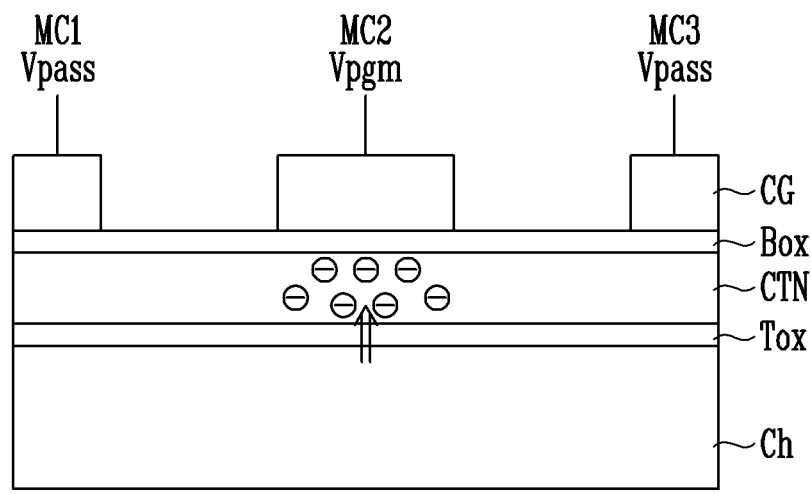
FIG. 23 is a sectional view of the memory cells, illustrating operation S930 shown in FIG. 19.
FIG. 24 is a diagram illustrating voltages applied to the memory cells in a program operation of a selected memory cell in the operation S930 shown in FIG. 19.

FIG. 23 is a sectional view of the memory cells, illustrating the operation S930 shown in FIG. 19.

FIG. 24 is a diagram illustrating voltages applied to the memory cells in the program operation of the selected memory cell in the operation S930 shown in FIG. 19.

Referring to FIGS. 23 and 24, in the program operation of the selected memory cell MC2, the program operation of the selected memory cell MC2 is performed by applying a program voltage Vpgm to the word line of the selected memory cell MC2. Therefore, electrons of the channel layer CH are introduced and trapped in the charge storage layer CTN of the selected memory cell MC2. The pass voltage Vpass is applied to the word lines of the first and second adjacent memory cells MC1 and MC3.

When the program operation of the selected memory cell MC2 is completed, an operation of measuring the first noise value is performed. The operation of measuring the first noise value may be performed similarly to the above-described operation of measuring the initial noise value. For example, in the operation of measuring the first noise value, the memory device 1100 applies the pass voltage Vpass to the word lines of the selected memory cell MC2 and the first and second adjacent memory cells MC1 and MC3 adjacent to the selected memory cells MC2 among a plurality of memory cells included in a selected memory block (e.g., MB1). Also, the memory device 1100 may apply a constant voltage (e.g., Vcc) to a bit line (e.g., BL1).

The measuring apparatus MT measures the first noise value of the selected memory cell MC2 by using the cell current $I_{SD}$ of the selected memory cell MC2.

Figures 25, 26:
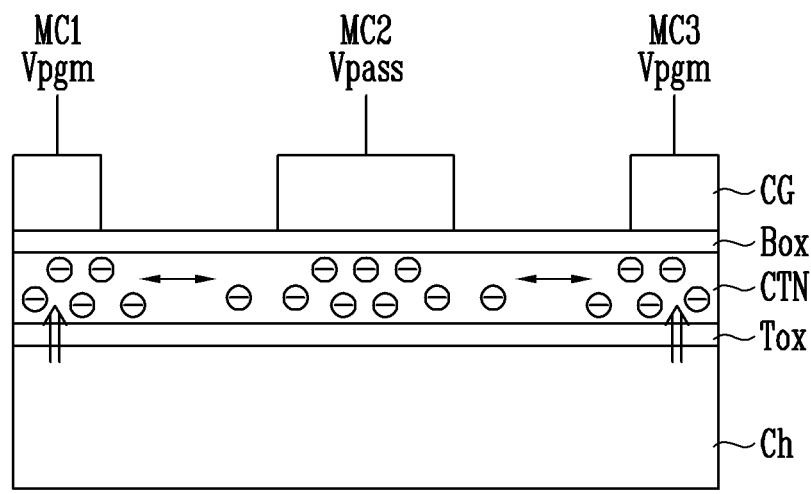
FIG. 25 is a sectional view of the memory cells, illustrating operation S950 shown in FIG. 19.
FIG. 26 is a diagram illustrating voltages applied to the memory cells in a program operation of adjacent memory cells in the operation S950 shown in FIG. 19.

FIG. 25 is a sectional view of the memory cells, illustrating the operation S950 shown in FIG. 19.

FIG. 26 is a diagram illustrating voltages applied to the memory cells in the program operation of the adjacent memory cells in the operation S950 shown in FIG. 19.

Referring to FIGS. 25 and 26, in the program operation of the first and second adjacent memory cells MC1 and MC3, the program operation of the first and second adjacent memory cells MC1 and MC3 is performed by applying the program voltage Vpgm to the word lines of the first adjacent memory cell MC1 and the second adjacent memory cell MC3. Therefore, electrons of the channel layer Ch are introduced and trapped in the charge storage layer CTN of the first and second adjacent memory cells MC1 and MC3. The pass voltage Vpass is applied to the word line of the selected memory cell MC2.

When the program operation of the first and second adjacent memory cell MC1 and MC3 is completed, an operation of measuring the second noise value is performed. The operation of measuring the second noise value may be performed similarly to the above-described operation of measuring the first noise value. For example, in the operation of measuring the second noise value, the memory device 1100 applies the pass voltage Vpass to the word lines of the selected memory cell MC2 and the adjacent memory cells MC1 and MC3 adjacent to the selected memory cells MC2 among a plurality of memory cells included in a selected memory block (e.g., MB1). Also, the memory device 1100 may apply a constant voltage (e.g., Vcc) to a bit line (e.g., BL1).

The measuring apparatus MT measures the second noise value of the selected memory cell MC2 by using the cell current $I_{SD}$ of the selected memory cell MC2.

Figures 27, 28:
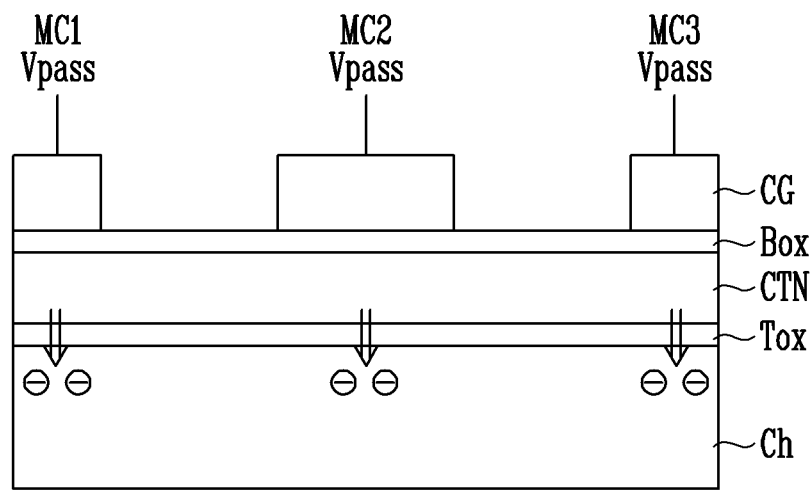
FIG. 27 is a sectional view of the memory cells, illustrating operation S970 shown in FIG. 19.
FIG. 28 is a diagram illustrating voltages applied to the memory cells when a third noise value is measured in the operation S970 shown in FIG. 19.

FIG. 27 is a sectional view of the memory cells, illustrating the operation S970 shown in FIG. 19.

FIG. 28 is a diagram illustrating voltages applied to the memory cells when the third noise value is measured in the operation S970 shown in FIG. 19.

Referring to FIGS. 27 and 28, in the erase operation, electrons trapped in the charge storage layer CTN of the selected memory cell MC2 and the first and second adjacent memory cells MC1 and MC3 are detrapped to be disposed to the channel layer Ch.

When the third noise value is measured, the memory device 1100 applies the pass voltage Vpass to the word lines of the selected memory cell MC2 and the memory cells MC1 and MC3 adjacent to the selected memory cells MC2 among a plurality of memory cells included in a selected memory block (e.g., MB1). Also, the memory device 1100 may apply a constant voltage (e.g., Vcc) to a bit line (e.g., BL1).

The measuring apparatus MT measures the third noise value of the selected memory cell MC2 by using the cell current $I_{SD}$ of the selected memory cell MC2.

In the above-described another embodiment of the present disclosure, a case where the selected memory cell and the first and second adjacent memory cells are programmed to one program state P1 has been described. However, the selected memory cell may be programmed to one of the plurality of program states P1 to P7, and an interference measurement operation may be performed for each of the plurality of program states P1 to P7 of the first adjacent memory cell and for each of the plurality of program states P1 to P7 of the second adjacent memory cell. That is, the interference on the memory cells can be analyzed in more detail by performing the interference measurement operation according to the program state of the selected memory cell and each of the program states of the first and second adjacent memory cells.

Figure 29:
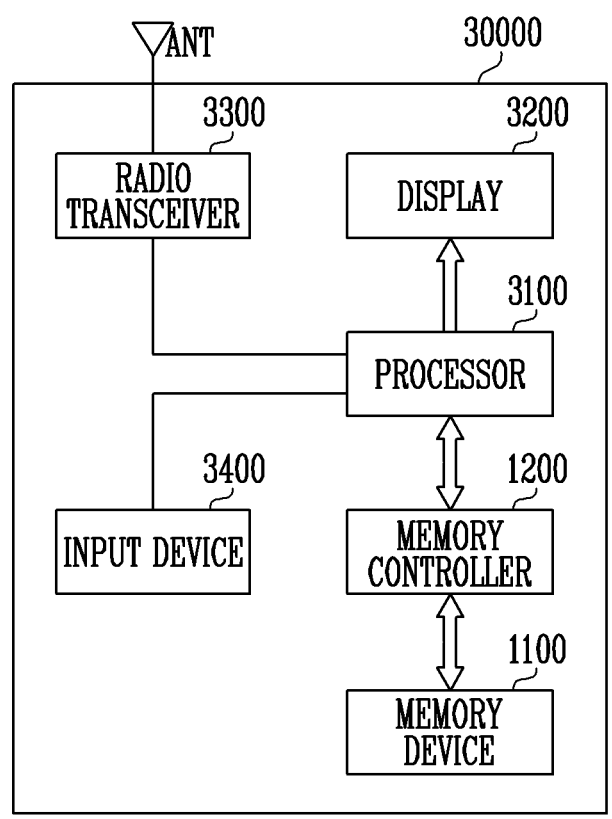
FIG. 29 is a diagram illustrating another embodiment of the memory system including the memory device shown in FIG. 2.

FIG. 29 is a diagram illustrating another embodiment of the memory system including the memory device shown in FIG. 2.

Referring to FIG. 29, the memory system 30000 may be implemented as a cellular phone, a smart phone, a tablet PC, a personal digital assistant (PDA), or a wireless communication device. The memory system 30000 may include a memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad, a computer mouse, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 30:
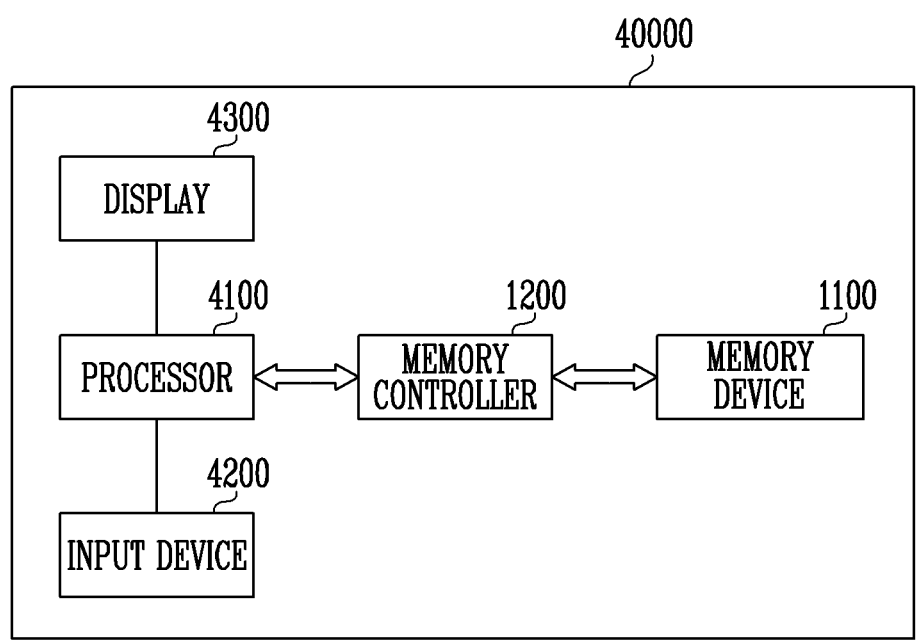
FIG. 30 is a diagram illustrating another embodiment of the memory system including the memory device shown in FIG. 2.

FIG. 30 is a diagram illustrating another embodiment of the memory system including the memory device shown in FIG. 2.

Referring to FIG. 30, the memory system 40000 may be implemented as a personal computer (PC), a tablet PC, a net-book, an e-reader, a personal digital assistant (PDA), a portable multi-media player (PMP), an MP3 player, or an MP4 player.

The memory system 40000 may include a memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad, a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 31:
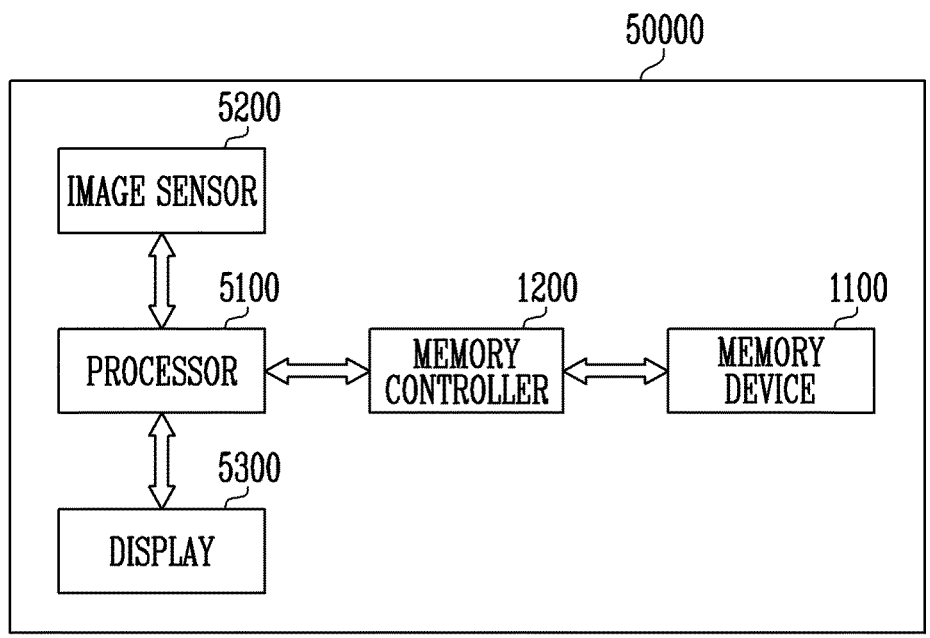
FIG. 31 is a diagram illustrating another embodiment of the memory system including the memory device shown in FIG. 2.

FIG. 31 is a diagram illustrating another embodiment of the memory system including the memory device shown in FIG. 2.

Referring to FIG. 31, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 32:
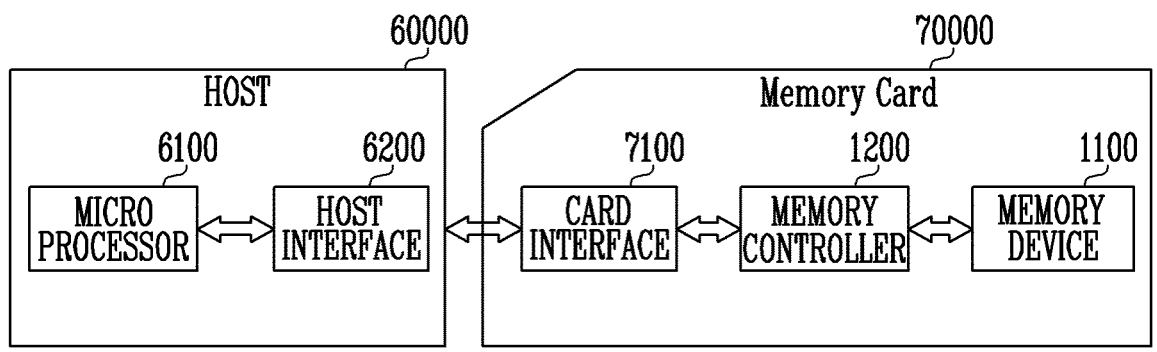
FIG. 32 is a diagram illustrating another embodiment of the memory system including the memory device shown in FIG. 2.

FIG. 32 is a diagram illustrating another embodiment of the memory system including the memory device shown in FIG. 2.

Referring to FIG. 32, the memory system 70000 may be implemented as a memory card or a smart card. The memory system 70000 may include a memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

In accordance with the present disclosure, interference caused by adjacent memory cells among memory cells included in the memory device is accurately measured.

Accordingly, a threshold voltage distribution of programmed memory cells can be accurately predicted, and the stability of read data can be improved by setting a read voltage used in a read operation, based on the measured interference.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for measuring interference in a memory device, the method comprising:
   programming a selected memory cell among a plurality of memory cells connected in series between a bit line and a source line;
   measuring a first noise value of the programmed selected memory cell;
   programming an adjacent memory cell adjacent to the selected memory cell among the plurality of memory cells;
   measuring a second noise value of the selected memory cell, after the programming of the adjacent memory cell is completed; and
   determining interference on the selected memory cell based on the first noise value and the second noise value,
   wherein the first noise value and the second noise value are measured by detecting a low frequency noise of a cell current of the selected memory cell.

2. The method of claim 1, further comprising measuring an initial noise value of the selected memory cell before the programming of the selected memory cell.

3. The method of claim 2, wherein the measuring of the initial noise value includes:
   applying a pass voltage to the selected memory cell and the adjacent memory cell in an erase state; and
   detecting the low frequency noise of the cell current of the selected memory cell in a state in which a measurement voltage is applied to the bit line.

4. The method of claim 1,
   wherein the selected memory cell is programmed to one program state among a plurality of program states, and
   wherein the adjacent memory cell is programmed to one program state among the plurality of program states.

5. The method of claim 1, wherein the measuring of the first noise value and the second noise value includes:
   applying a pass voltage to the selected memory cell and the adjacent memory cell; and
   detecting the low frequency noise of the cell current of the selected memory cell in a state in which a measurement voltage is applied to the bit line.

6. The method of claim 1, further comprising:
   erasing the selected memory cell and the adjacent memory cell, after the second noise value is measured; and
   measuring a third noise value of the selected memory cell after the selected memory cell and the adjacent memory cell are erased.

7. The method of claim 6,
   wherein the third noise value is further measured by detecting the low frequency noise of the cell current, and
   wherein the detecting of the low frequency noise of the cell current includes:
   converting the cell current of the selected memory cell into a voltage; and
   detecting a low frequency noise of the voltage.

8. The method of claim 1, wherein the adjacent memory cell is a memory cell adjacent to the selected memory cell in a bit line direction or a source line direction.

9. A method for measuring interference in a memory device, the method comprising:
   measuring an initial noise value of a selected memory cell among a plurality of memory cells connected in series between a bit line and a source line;
   programming the selected memory cell;
   measuring a first noise value of the programmed selected memory cell;
   programming an adjacent memory cell adjacent to the selected memory cell among the plurality of memory cells;
   measuring a second noise value of the selected memory cell after the programming of the adjacent memory cell is completed;
   erasing the selected memory cell and the adjacent memory cell;
   measuring a third noise value of the selected memory cell after the selected memory cell and the adjacent memory cell are erased; and
   determining interference on the selected memory cell based on the initial noise value, the first noise value, the second noise value, and the third noise value.

10. The method of claim 9, wherein the initial noise value, the first noise value, the second noise value, and the third noise value are measured by detecting a low frequency noise of a cell current of the selected memory cell.

11. The method of claim 10, wherein each of the measuring of the initial noise value, the measuring of the first noise value, the measuring of the second noise value, and the measuring of the third noise value includes:
   applying a pass voltage to the selected memory cell and the adjacent memory cell; and
   detecting the low frequency noise of the cell current of the selected memory cell.

12. The method of claim 11, wherein the detecting of the low frequency noise of the cell current of the selected memory cell includes:
- converting the cell current of the selected memory cell into a voltage; and
- detecting a low frequency noise of the voltage.

13. The method of claim 9,
- wherein the selected memory cell is programmed to one program state among a plurality of program states, and
- wherein the adjacent memory cell is programmed to one program state among the plurality of program states.

14. The method of claim 9, wherein the adjacent memory cell is a memory cell adjacent to the selected memory cell in a bit line direction or a source line direction.

15. A method for measuring interference in a memory device, the method comprising:
- measuring an initial noise value of a selected memory cell among a plurality of memory cells connected in series between a bit line and a source line;
- programming the selected memory cell;
- measuring a first noise value of the programmed selected memory cell;
- programming a first adjacent memory cell and a second adjacent memory cell, which are adjacent to the selected memory cell among the plurality of memory cells;
- measuring a second noise value of the selected memory cell after the programming of the first adjacent memory cell and the second adjacent memory cell is completed;
- erasing the selected memory cell, the first adjacent memory cell, and the second adjacent memory cell;
- measuring a third noise value of the selected memory cell after the selected memory cell, the first adjacent memory cell, and the second adjacent memory cell are erased; and
- determining interference on the selected memory cell based on the initial noise value, the first noise value, the second noise value, and the third noise value.

16. The method of claim 15, wherein the initial noise value, the first noise value, the second noise value, and the third noise value are measured by detecting a low frequency noise of a cell current of the selected memory cell.

17. The method of claim 16, wherein each of the measuring of the initial noise value, the measuring of the first noise value, the measuring of the second noise value, and the measuring of the third noise value includes:
- applying a pass voltage to the selected memory cell, the first adjacent memory cell, and the second adjacent memory cell; and
- detecting the low frequency noise of the cell current of the selected memory cell.

18. The method of claim 17, wherein the detecting of the low frequency noise of the cell current of the selected memory cell includes:
- converting the cell current of the selected memory cell into a voltage; and
- detecting a low frequency noise of the voltage.

19. The method of claim 15,
- wherein the selected memory cell is programmed to one program state among a plurality of program states, and
- wherein each of the first adjacent memory cell and the second adjacent memory cell is programmed to one program state among the plurality of program states.

20. The method of claim 15, wherein the first adjacent memory cell is a memory cell adjacent to the selected memory cell in a source line direction, and the second adjacent memory cell is a memory cell adjacent to the selected memory cell in a bit line direction.

* * * * *